(12) United States Patent
Burney (10) Patent No.: US 7,057,412 B1
(45) Date of Patent: Jun. 6, 2006

(54) CONFIGURABLE CROSSBAR SWITCH

(75) Inventor: Ali H Burney, Fremont, CA (US)

(73) Assignee: Altera Corporation, San Jose, CA (US)

(*) Notice: Subject to any disclaimer, the term of this patent is extended or adjusted under 35 U.S.C. 154(b) by 82 days.

(21) Appl. No.: 10/734,474

(22) Filed: Dec. 12, 2003

(51) Int. Cl.
H03K 19/173 (2006.01)
G06F 7/38 (2006.01)

(52) U.S. Cl. .................. 326/38; 326/41; 326/47; 710/317

(58) Field of Classification Search .......... 326/37–41, 326/47; 710/317
See application file for complete search history.

(56) References Cited

U.S. PATENT DOCUMENTS

| | | | |
|---|---|---|---|
| 5,821,773 A | 10/1998 | Norman et al. | 326/39 |
| 5,963,048 A * | 10/1999 | Harrison et al. | 326/39 |
| 6,002,268 A | 12/1999 | Sasaki et al. | |
| 6,060,903 A * | 5/2000 | Rangasayee et al. | 326/39 |
| 6,130,550 A * | 10/2000 | Zaliznyak et al. | 326/39 |
| 6,181,159 B1 | 1/2001 | Rangasayee | 326/39 |
| 6,404,225 B1 * | 6/2002 | Rangasayee | 326/39 |
| 6,715,023 B1 * | 3/2004 | Abu-Lebdeh et al. | 710/317 |
| 6,759,869 B1 * | 7/2004 | Young et al. | 326/41 |
| 2005/0021749 A1 * | 1/2005 | Donlin et al. | 709/225 |

OTHER PUBLICATIONS

Altera Corporation "SameFrame Pin-Out Design for FineLine BGA Packages," Application Note 90, Version 1.01, Sep. 2000, pp. 1-14.
U.S. Appl. No. 10/383,304, filed Mar. 5, 2003, Burney et al.
U.S. Appl. No. 10/383,312, filed Mar. 5, 2003, Burney et al.
U.S. Appl. No. 10/454,728, filed Jun. 3, 2003, Hutton et al.

* cited by examiner

Primary Examiner—Daniel Chang
(74) Attorney, Agent, or Firm—Fish & Neave IP Group Ropes & Gray LLP (57) ABSTRACT

A configurable crossbar switch is provided between the signaling I/O and the IP block in a programmable logic resource. A programmable logic resource receives input data via an I/O port. This data is decoded in an I/O buffer and sent as input to a crossbar switch that can be configured to send the data to any one of the data ports in the IP block. Similarly, data from the IP block can be sent via a data port to a crossbar switch that can be configured to send the data to an I/O buffer that encodes the data for output to any one of the I/O ports. The use of crossbar switch provides greater flexibility in the design of a programmable logic resource and reduces connectivity problems.

17 Claims, 8 Drawing Sheets

CONFIGURABLE CROSSBAR SWITCH

BACKGROUND OF THE INVENTION

This invention relates to programmable logic resources. More particularly, this invention relates to providing more flexible connectivity between signaling input-output (I/O) and an intellectual property block in a programmable logic resource.

Programmable logic resource technology is well known for its ability to allow a common hardware design (embodied in an integrated circuit) to be programmed to meet the needs of many different applications. Known examples of programmable logic resource technology include programmable logic devices (PLDs), complex programmable logic devices (CPLDs), erasable programmable logic devices (EPLDs), electrically erasable programmable logic devices (EEPLDs), and field programmable gate arrays (FPGAs).

A programmable logic resource is typically embedded on a silicon chip that sits in a package containing pins. The programmable logic resource has signaling I/O ports along the periphery of the programmable logic resource that allows data to be received from and transmitted to the pins on the package. The package is typically mounted on a circuit board, which allows for the programmable logic resource to communicate with circuitry external to the package. The circuit board contains wiring that connects the pins to other components on the circuit board.

To facilitate the use of programmable logic resources in certain applications, intellectual property (IP) blocks are coupled to programmable logic resource core circuitry. Data from circuitry external to the package is typically sent to a programmable logic resource through a particular pin and to a corresponding I/O port where the data is decoded and sent to a corresponding data port in the IP block for processing. Similarly, data from the IP block is typically sent to circuitry external to the package through a data port to a corresponding I/O port where the data is encoded and sent to a corresponding pin for output.

During the design stage of a programmable logic resource, a user may not know the size of the programmable logic resource. Often during the same time, a board vendor will design a circuit board having fixed pin connections that support a particular package in which a programmable logic resource is to be located. Because the circuit board is designed with fixed pin connections, the resulting programmable logic resource will be placed in the particular package for which the circuit board is designed to support. However, with different possible sizes of programmable logic resources, the locations of the I/O ports and corresponding data ports at the IP block of the programmable logic resource may change relative to the pin locations for a given package, thereby causing connectivity problems. The data ports in the IP block cannot be easily reconfigured so that the data ports and corresponding I/O ports are matched up with the correct pins without incurring additional costs. In addition, the circuit board cannot be easily rewired so that the pins are matched up with the correct I/O ports and corresponding data ports without incurring additional costs. As a result, extra wiring is typically used to route data between a particular pin to a corresponding I/O port. However, this extra wiring can be limited by the available space for the extra wiring, can cause additional delay times, and can cause further connectivity problems.

In view of the foregoing, it would be desirable to provide more flexible connectivity (i.e., vertical migration) between signaling I/O and an intellectual property block in a programmable logic resource.

SUMMARY OF THE INVENTION

In accordance with the invention more flexible connectivity (i.e., vertical migration) between signaling input-output (I/O) and an intellectual property (IP) block in a programmable logic resource is provided.

Vertical migration is achieved by providing a configurable crossbar switch between the signaling I/O and the IP block in a programmable logic resource. A programmable logic resource receives input data via an I/O port. This data is decoded in an I/O buffer and sent as input to a crossbar switch that can be configured to send the data to any one of the data ports in the IP block. Similarly, data from the IP block can be sent via a data port to a crossbar switch that can be configured to send the data to an I/O buffer that encodes the data for output to any one of the I/O ports. The crossbar switch can be configured based on different factors including, for example, the design of the programmable logic resource, the package in which the programmable logic resource is to sit, and the routing from the package pins to the other components in a circuit board. Because of the flexibility in connecting any of the I/O ports in the I/O buffer to any of the data ports in the IP block, each package pin can be routed to the best possible I/O port rather than to the I/O port that directly corresponds to a particular data port in the IP block.

The use of a crossbar switch advantageously provides greater flexibility in the design of a programmable logic resource. The invention also advantageously reduces connectivity problems between the signaling I/O and an IP block. The invention further reduces the amount of routing needed while not requiring the IP block to be reconfigured or the circuit board to be rewired in order to correctly connect the signaling I/O to the IP block.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION

In accordance with the invention, more flexible connectivity (i.e., vertical migration) between signaling input-output (I/O) and an intellectual property (IP) block in a programmable logic resource is provided. A crossbar switch is provided between the signaling I/O and the IP block in a programmable logic resource. A programmable logic resource receives input data via an I/O port. This data is decoded in an I/O buffer and sent as input to a crossbar switch that can be configured to send the data to any one of the data ports in the IP block. Similarly, data from the IP block can be sent via a data port to a crossbar switch that can be configured to send the data to an I/O buffer that encodes the data for output to any one of the I/O ports. The crossbar switch can be configured based on different factors including, for example, the design of the programmable logic resource, the package in which the programmable logic resource is to sit, and the routing from the package pins to the other components in a circuit board. Because of the flexibility in connecting any of the I/O ports in the I/O buffer to any of the data ports in the IP block, each package pin can be routed to the best possible I/O port rather than to the I/O port that directly corresponds to a particular data port in the IP block.

A board vendor will design a circuit board having different components that are routed together to allow data to flow between the different components. The different components can include logic gates, circuits designed to perform particular functions, programmable logic resources, memories, processors, input/output circuitry, peripheral devices, and any other suitable components. Some of these different components are typically placed in a package that has external pins to allow data to flow into and out of the component. Each package can be mounted onto the circuit board at designated locations, with the pins making contact with the circuit board at fixed pin locations. Wiring is used to route data between the fixed pin locations and other components on the circuit board.

Figure 1:
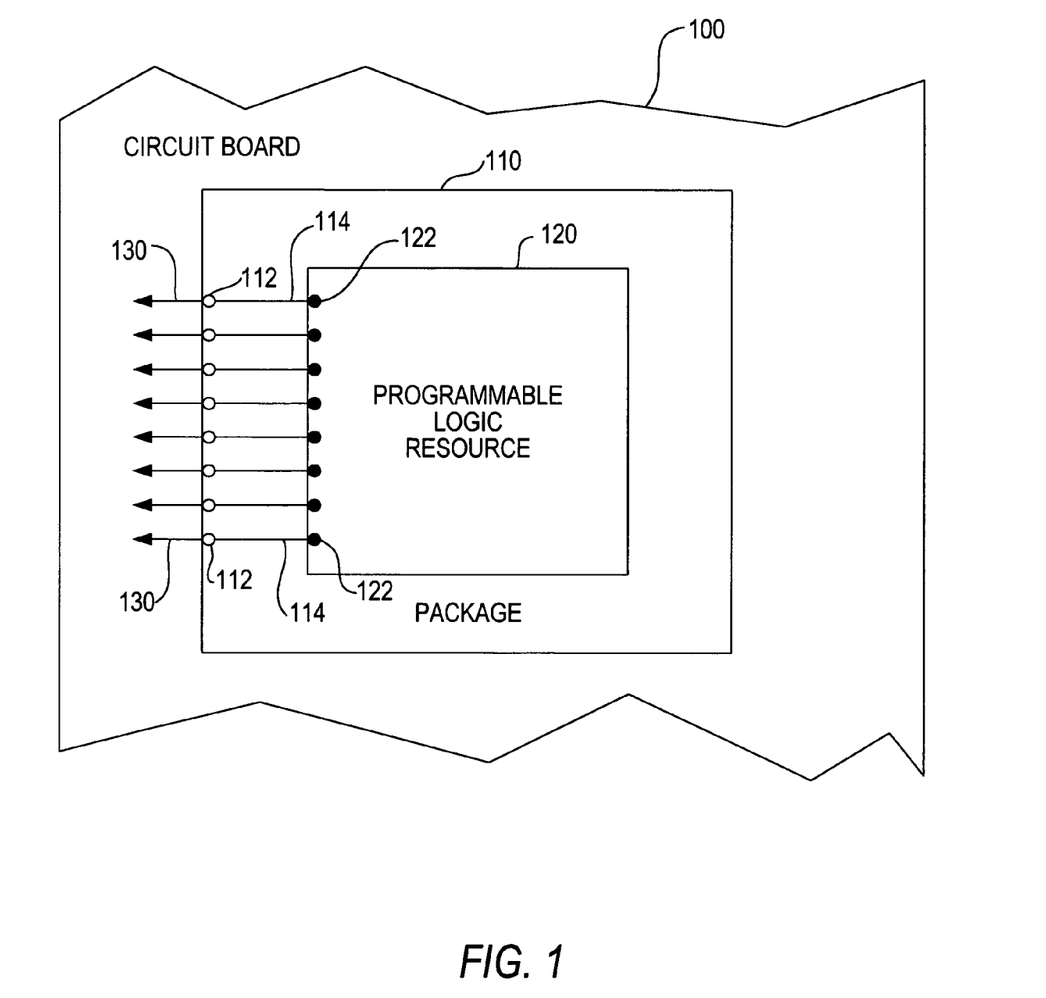
FIGS. 1–2 are simplified diagrams of a circuit board.

FIG. 1 is a partial diagram of a circuit board 100. A package 110 containing a programmable logic resource 120 is mounted on circuit board 100. Package 110 has external pins 112 that make contact with circuit board 100 at fixed pin locations. Circuit board 100 includes wiring 130 used to route data between each pin 112 to a designated location throughout circuit board 100. Data can be sent between programmable logic resource 120 and circuit board 100 via pins 112, wiring 114, and I/O ports 122 located along the periphery of programmable logic resource 120. The data sent along wiring 130 and wiring 114 can be sent via any suitable signals including single-ended I/O signals and differential I/O signals (e.g., low voltage differential signaling (LVDS) I/O).

Figure 2:
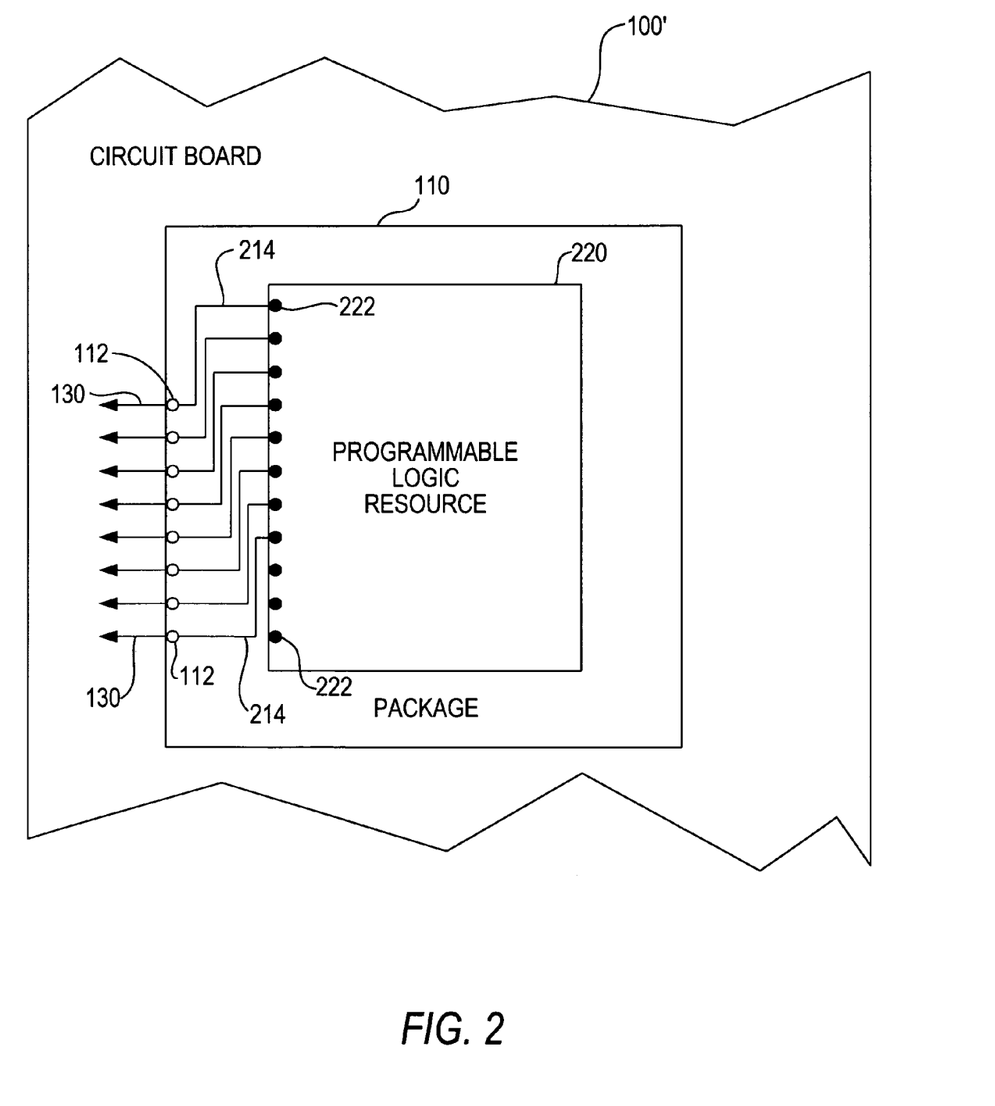

FIG. 2 is a partial diagram of circuit board 100' when a larger programmable logic resource 220 is provided. Programmable logic resource 220 is placed in the same package 110 for which circuit board 100' is designed to support. Pins 112 make contact with circuit board 100' at the same fixed pin locations. Circuit board 100' also includes the same wiring 130 used to route data between each pin 112 to a designated location throughout circuit board 100'. Because a larger programmable logic resource 220 is provided, the locations of the I/O ports 222 in programmable logic resource 220 are no longer aligned with the locations of corresponding pins 112. In an existing approach, extra wiring 214 is needed to connect I/O port 222 to a corresponding pin 112.

Figure 3:
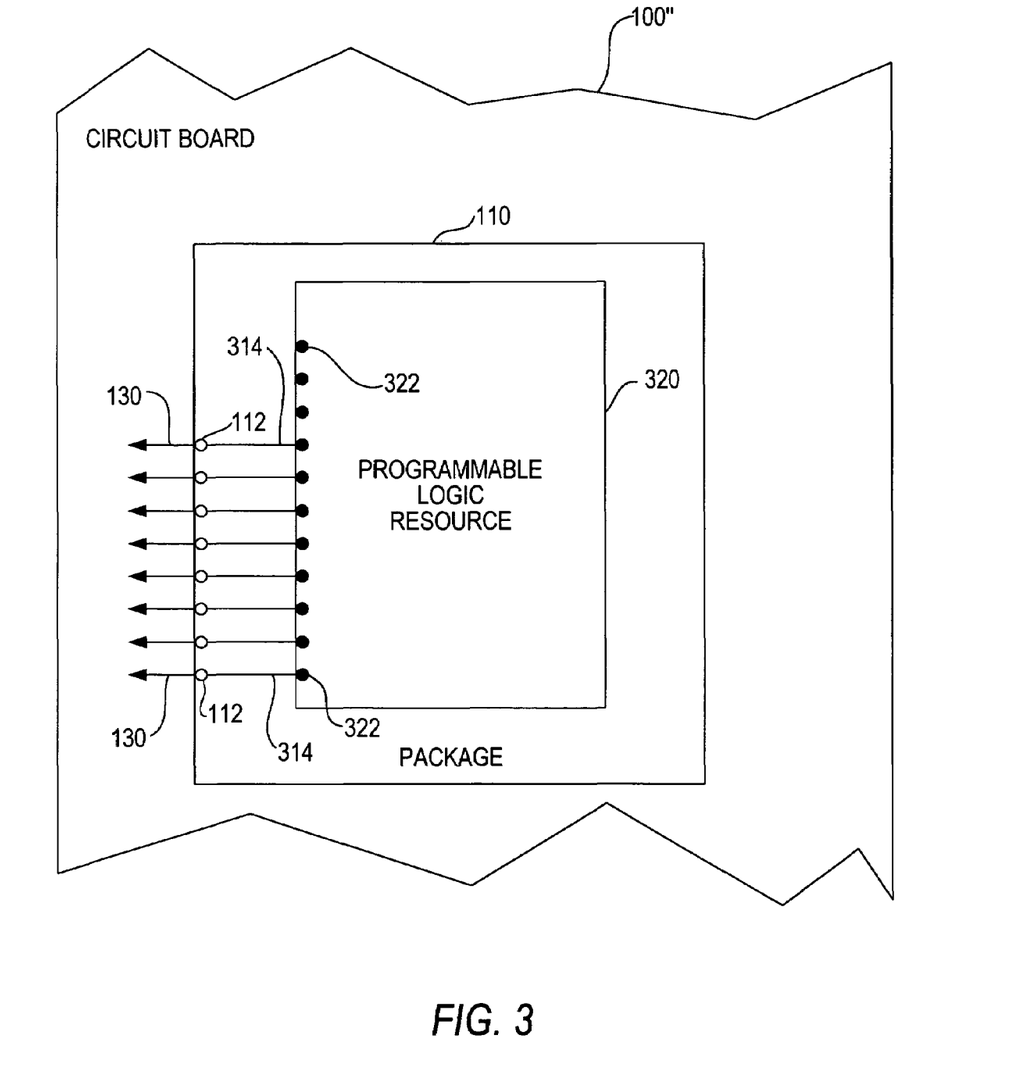
FIG. 3 is a simplified diagram of a circuit board in accordance with the invention.

To provide more flexible connectivity, a crossbar can be implemented in the programmable logic resource to allow any suitable package pin to be connected to any suitable I/O port on a programmable logic resource without requiring each package pin to be connected to a corresponding I/O port on the programmable logic resource. FIG. 3 is a partial diagram of circuit board 100" when a larger programmable logic resource 320 is provided in accordance with the invention. Instead of using extra wiring 214 to connect I/O port 222 to a corresponding pin 112 as shown in FIG. 2, wiring 314 can be used to connect a given pin 112 to the closest available I/O port 322.

Figure 4:
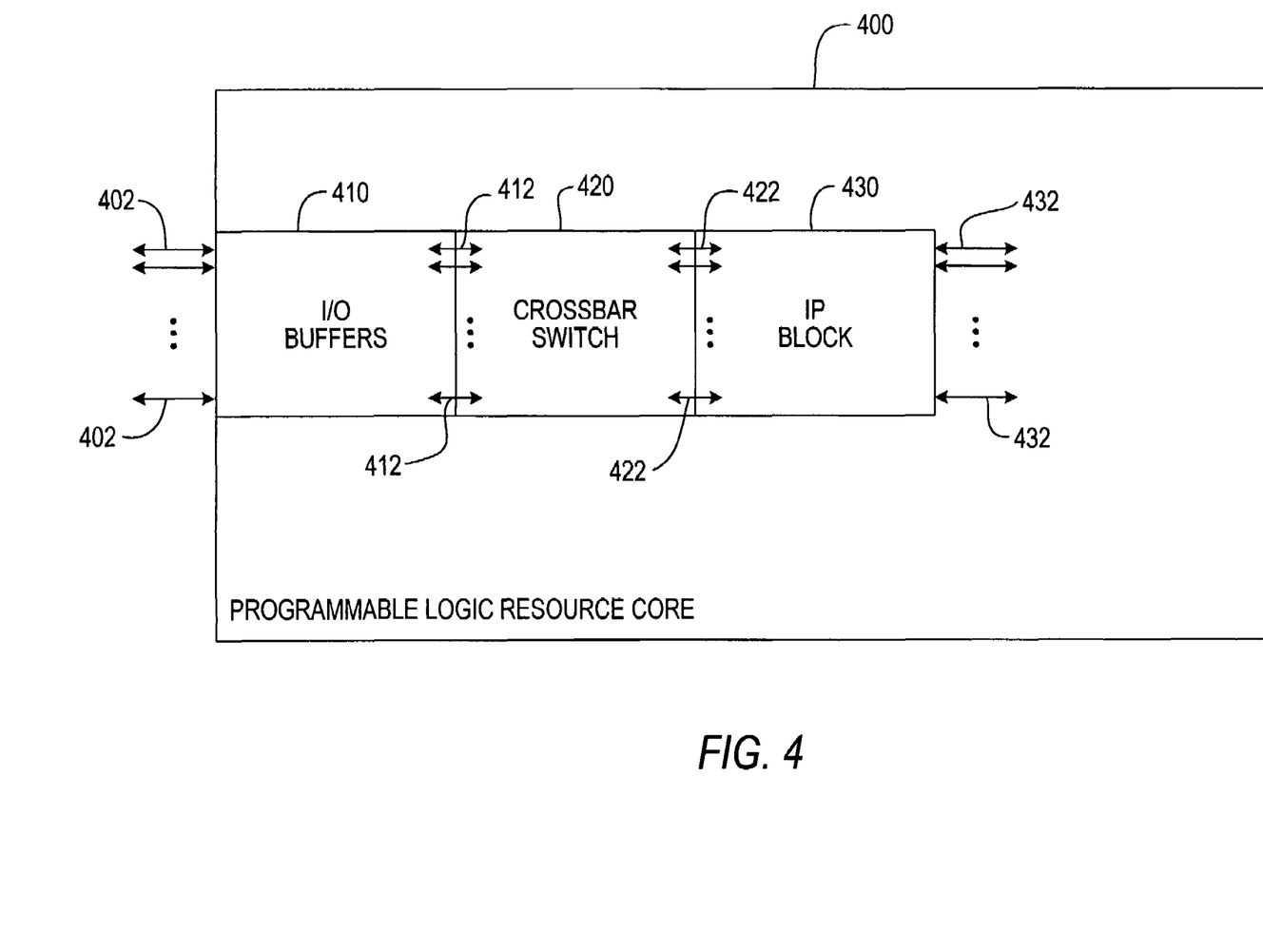
FIG. 4 is a simplified block diagram of a programmable logic resource core in accordance with the invention.

Circuitry such as a crossbar switch can be provided in programmable logic resource 320 to allow data to flow between an I/O port 322 and a corresponding data port in an IP block as shown in FIG. 4. A programmable logic resource (e.g., resource 320) can include a programmable logic resource core 400, I/O buffers 410, a crossbar switch 420, and an IP block 430. Programmable logic resource core 400 can be typical programmable logic circuitry of any of several known types and constructions. IP block 430 can be a soft IP block in which circuitry is programmed in as programmable logic. Circuitry is described in terms of gates and interconnections for the gates using a netlist or a hardware description language (e.g., Very High Speed Integrated Circuit Hardware Description Language (VHDL) or Verilog), which can be synthesized with the surrounding logic. In another embodiment, IP block 430 can be a hard IP block in which circuitry is custom-designed in hardware. In yet another embodiment, IP block 430 can be a firm IP block in which circuitry is partly designed in hardware but is configurable for various applications.

Although the invention is described herein primarily in the context of a crossbar switch on a programmable logic resource for clarity, the crossbar switch can be provided on any suitable device such as, for example, an application-specific standard product (ASSP), an application-specific integrated circuit (ASIC), a full-custom chip, or a dedicated chip.

Data can be transmitted along paths 402 (e.g., paths 314 and path 130) between programmable logic resource core 400 and other circuitry external programmable logic resource core 400. Programmable logic resource core 400 can receive data from paths 402 via I/O ports located along the periphery of the programmable logic resource core 400 at I/O buffers 410. I/O buffers 410 decode the input data and output the decoded data to a crossbar switch 420 via paths 412. Crossbar switch 420 can be configured to send the decoded data to any one of the data ports in IP block 430 via paths 422 for processing. Programmable logic resource core 400 can also transmit data onto paths 402. IP block 420 can send data through data ports to crossbar switch 420. Crossbar switch 420 can be configured to send the data to I/O buffers 410 via any one of paths 412. I/O buffers 410 encodes the data and outputs the encoded data onto paths 412 via the I/O ports. IP block 430 can send data to and receive data from programmable logic resource core 400 via paths 432.

In one embodiment, the crossbar switch can be a bi-directional switch. In another embodiment, the crossbar switch can be a uni-directional switch. To provide the flow of data between IP block 430 and I/O buffers 410, two uni-directional switches can be implemented. The configuration of the crossbar switch for the transmission of data from I/O buffers 410 to IP block 430 can be the same as or different from the configuration of the crossbar switch for the transmission of data from IP block 430 to I/O buffers 410.

Figure 5:
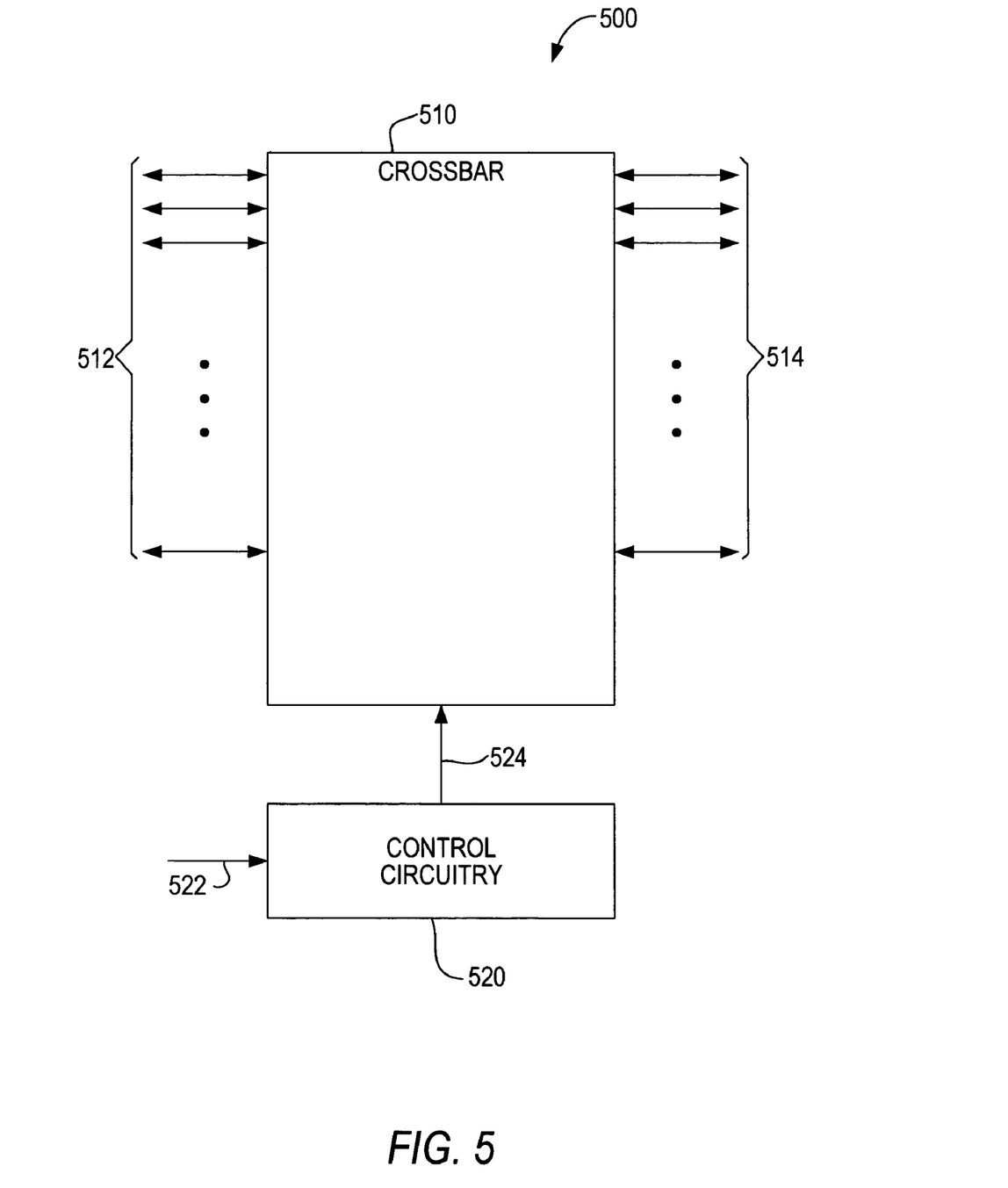
FIGS. 5–7 are simplified block diagrams of a crossbar switch in accordance with the invention.
Figure 6:
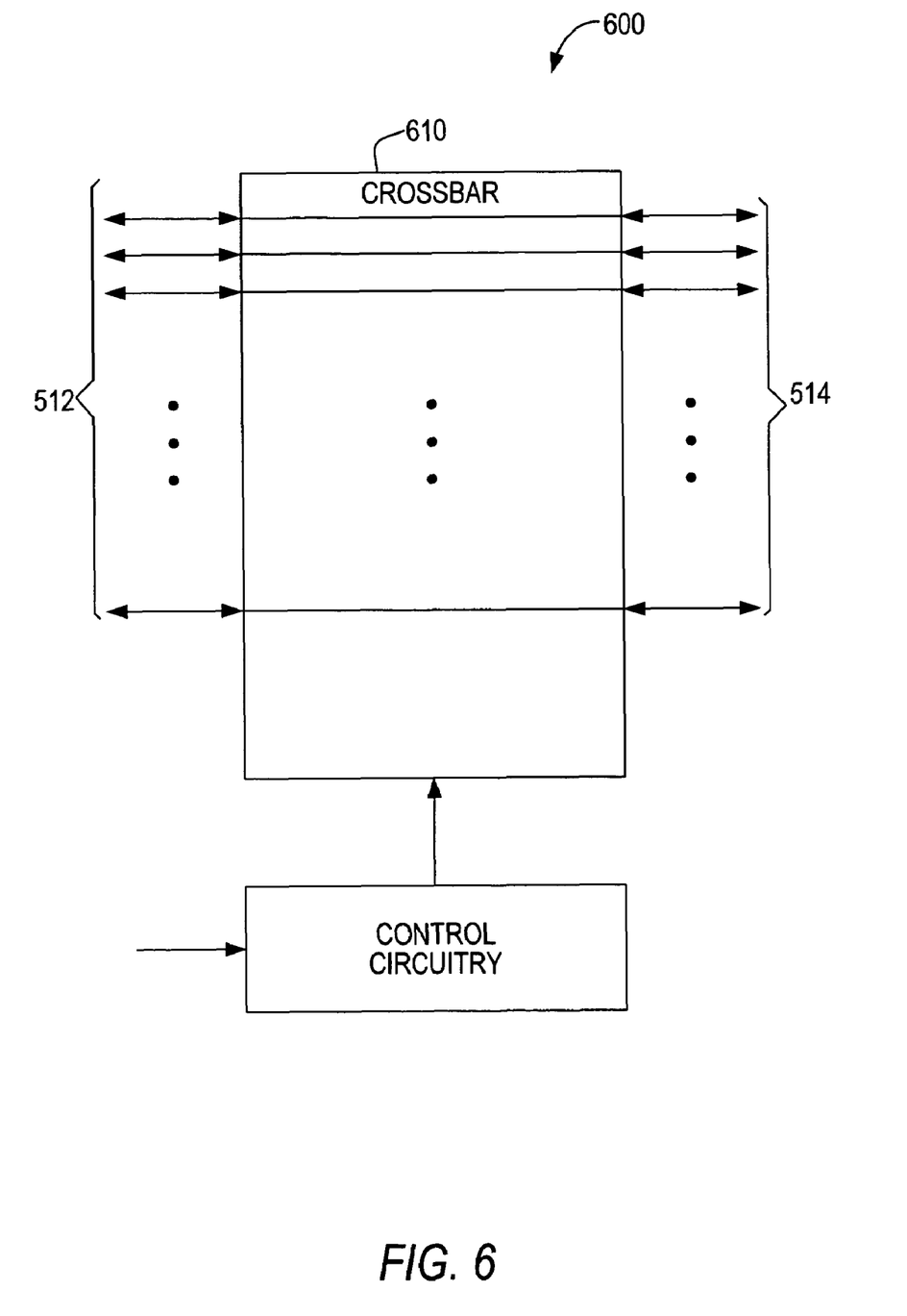
Figure 7:
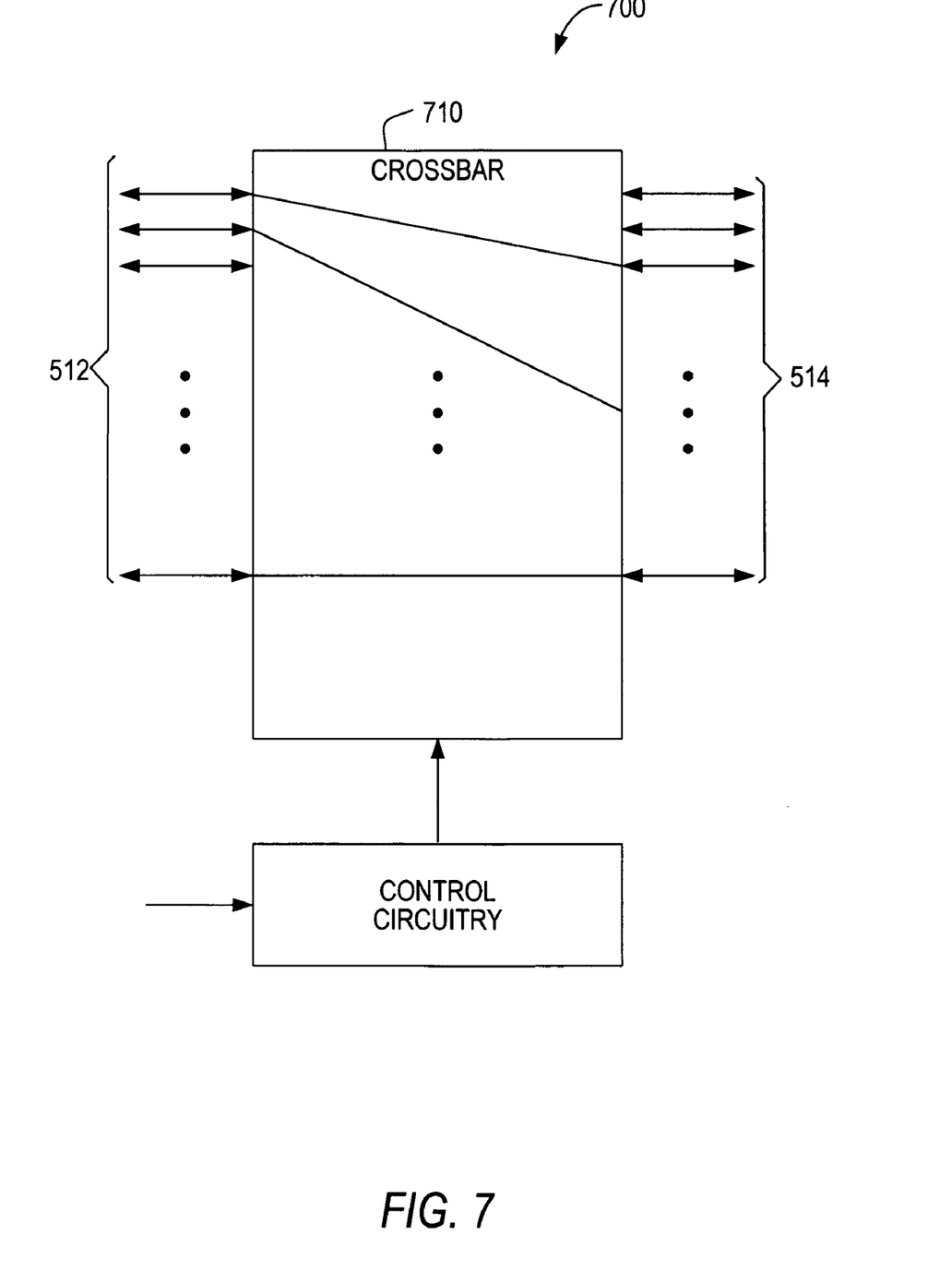

FIGS. 5–7 are simplified diagrams of a crossbar switch 500 in accordance with the invention. Crossbar switch 500 (e.g., crossbar switch 420) includes crossbar circuitry 510 and control circuitry 520. In one embodiment, crossbar circuitry 510 receives input data from I/O buffers (e.g., I/O buffers 410) via paths 512 (e.g., paths 412). Crossbar circuitry 510 can be configured to route each input data to any one of paths 514 (e.g., paths 422) for output to an IP block (e.g., IP block 430). In another embodiment, crossbar circuitry 510 receives input data from an IP block (e.g., IP block 430) via paths 514 (e.g., paths 422). Crossbar circuitry 510 can be configured to route each input data to any one of paths 512 (e.g., paths 412) for output to I/O buffers (e.g., I/O buffers 410).

Control circuitry 520 can receive as input a control signal 522 from programmable logic resource core 400, IP block 430, or any component on or external to circuit board 300 (e.g., another programmable logic resource, processor, memory, user input) via I/O buffers 410. Control circuitry 520 can, based on control signal 522, send data for configuration to crossbar circuitry 510 via path 524. Alternatively, control signal 522 can be sent directly to crossbar circuitry 510 for configuration. Control signals 522 can indicate the proper connections between paths 512 and paths 514 using any suitable approach.

FIG. 6 illustrates a configuration of a crossbar switch 600 when a programmable logic resource has been designed such that the I/O ports are properly aligned to the corresponding package pins (e.g., FIG. 1). Connections can be provided between the package pins and I/O ports such that data can be directly sent to and from corresponding data ports in an IP block. Crossbar circuitry 610 can be configured such that each path 512 is coupled to a directly corresponding path 514.

FIG. 7 illustrates a configuration of a crossbar switch 700 when a programmable logic resource has been designed such that the I/O ports are not properly aligned to the corresponding package pins (e.g., FIG. 3). Crossbar circuitry 710 can be configured to switch the connections between paths 512 and paths 514 such that each path 512 is coupled to a corresponding path 514.

A crossbar switch can be configured at any suitable time such as, for example, upon final design of a programmable logic resource, during initial configuration of the programmable logic resource, or during reconfiguration of the programmable logic resource. In another embodiment, to support changes in the routing of signals, the crossbar switch can be designed to be dynamically adjustable such that the crossbar switch can support different configurations while data is processing in the programmable logic resource or at another suitable time. Providing a configurable crossbar switch allows flexibility in the design of a programmable logic resource and also reduces connectivity problems.

Figure 8:
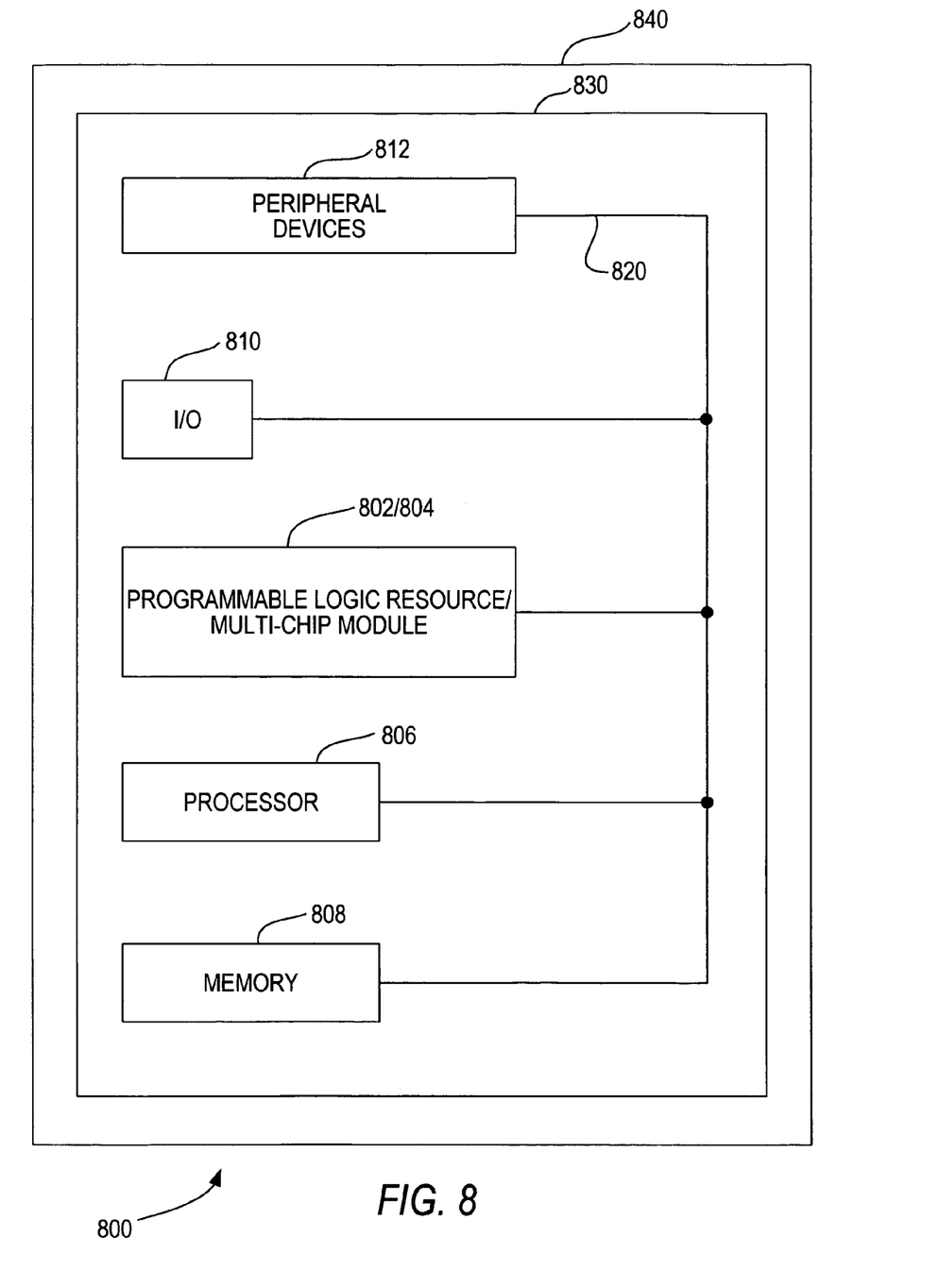
FIG. 8 is a simplified schematic block diagram of a system employing a programmable logic resource, multi-chip module, or other suitable device in accordance with the invention.

FIG. 8 illustrates a programmable logic resource 802, multi-chip module 804, or other device (e.g., ASSP, ASIC, full-custom chip, dedicated chip). which includes embodiments of this invention in a data processing system 800. Data processing system 800 can include one or more of the following components: a processor 806, memory 808, I/O circuitry 810, and peripheral devices 812. These components are coupled together by a system bus or other interconnections 820 and are populated on a circuit board 830 which is contained in an end-user system 840.

System 800 can be used in a wide variety of applications, such as computer networking, data networking, instrumentation, video processing, digital signal processing, or any other application where the advantage of using programmable or reprogrammable logic is desirable. Programmable logic resource/module 802/804 can be used to perform a variety of different logic functions. For example, programmable logic resource/module 802/804 can be configured as a processor or controller that works in cooperation with processor 806. Programmable logic resource/module 802/804 may also be used as an arbiter for arbitrating access to a shared resource in system 800. In yet another example, programmable logic resource/module 802/804 can be configured as an interface between processor 806 and one of the other components in system 800. It should be noted that system 800 is only exemplary, and that the true scope and spirit of the invention should be indicated by the following claims.

Various technologies can be used to implement programmable logic resources 802 or multi-chip modules 804 having the features of this invention, as well as the various components of those devices (e.g., programmable logic connectors ("PLCs") and programmable function control elements ("FCEs") that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be a product term logic, implementing functions such as AND, NAND, OR, or NOR. Examples of components suitable for implementing PLCs include EPROMs, EEPROMs, pass transistors, transmission gates, antifuses, laser fuses, metal optional links, etc. PLCs and other circuit components may be controlled by various, programmable, function control elements ("FCEs"). For example, FCEs can be SRAMS, DRAMS, magnetic RAMS, ferro-electric RAMS, first-in first-out ("FIFO") memories, EPROMS, EEPROMs, function control registers, ferro-electric memories, fuses, antifuses, or the like. From the various examples mentioned above it will be seen that this invention is applicable to both one-time-only programmable and reprogrammable resources.

Thus it is seen that providing a configurable crossbar switch advantageously allows flexibility in the design of a programmable logic resource and reduces connectivity problems. One skilled in the art will appreciate that the invention can be practiced by other than the prescribed embodiments, which are presented for purposes of illustration and not of limitation, and the invention is limited only by the claims which follow.

What is claimed is:

1. A programmable logic resource comprising:
    an input/output (I/O) buffer that receives data from circuitry external to the programmable logic resource and generates a plurality of outputs;
    a crossbar switch that receives the plurality of outputs from the I/O buffer and generates a plurality of outputs, wherein the crossbar switch is configured to send at least one of the plurality of outputs from the I/O buffer to a corresponding one of the plurality of outputs of the crossbar switch; and
    an intellectual property block that receives the plurality of outputs of the crossbar switch for processing:
        wherein the programmable logic resource is embedded in a package having a plurality of pins through which the external circuitry sends data, the programmable logic resource having a plurality of I/O ports located along the periphery of the programmable logic resource, wherein at least one of the plurality of pins sends data to a nearest available one of the plurality of I/O ports such that the at least one pin corresponds to other than the nearest available I/O port.

2. The programmable logic resource of claim 1 wherein the I/O buffer:
    receives the data at the plurality of I/O ports; and
    decodes the data to generate the plurality of outputs.

3. A digital processing system comprising:
processing circuitry;
a memory coupled to the processing circuitry; and
a programmable logic resource as defined in claim 1 coupled to the processing circuitry and the memory.

4. A printed circuit board on which is mounted a programmable logic resource as defined in claim 3.

5. The printed circuit board defined in claim 4 further comprising:
a memory mounted on the printed circuit board and coupled to the programmable logic resource.

6. The printed circuit board defined in claim 4 further comprising:
processing circuitry mounted on the printed circuit board and coupled to the programmable logic resource.

7. A printed circuit board comprising:
processing circuitry mounted on the printed circuit board;
a memory mounted on the printed circuit board and coupled to the processing circuitry; and
a package having a plurality of pins mounted on the printed circuit board at fixed pin locations and coupled to the processing circuitry and the memory at the fixed pin locations, the package having embedded therein a programmable logic resource having a plurality of input/output (I/O) ports located along the periphery of the programmable logic resource, wherein at least one of the plurality of pins is coupled to a nearest available one of the plurality of I/O ports such that the at least one pin corresponds to other than the nearest available I/O port, and wherein the programmable logic resource comprises circuitry configured to send data from the nearest available I/O ports to a corresponding one of a plurality of data ports in an intellectual property block for processing.

8. The printed circuit board of claim 7 wherein the programmable logic resource further comprises an I/O buffer that receives the data from the plurality of I/O ports and decodes the data for output to the circuitry.

9. The printed circuit board of claim 7 wherein the circuitry is a configurable crossbar switch.

10. The printed circuit board of claim 7 wherein the circuitry is a dynamically adjustable crossbar switch.

11. A method of improving connectivity between signaling input/output (I/O) and an intellectual property block in a programmable logic resource comprising:
driving a signal to a fixed pin location on a circuit board upon which a package, having embedded therein the programmable logic resource, is mounted;
routing the signal from the fixed pin location to a nearest available I/O port located along the periphery of the programmable logic resource, wherein the fixed pin location corresponds to other than the nearest available I/O port; and
configuring a crossbar switch to route the signal from the nearest available I/O port to a corresponding data port in the intellectual property block for processing.

12. The method of claim 11 wherein driving the signal comprises sending the signal as output from one of processing circuitry and a memory.

13. The method of claim 11 wherein the signal is a low voltage differential signal.

14. The method of claim 11 further comprising decoding the signal received from the nearest available I/O port for output to the crossbar switch.

15. The method of claim 11 further comprising configuring the crossbar switch during initial configuration of the programmable logic resource.

16. The method of claim 11 further comprising configuring the crossbar switch during reconfiguration of all or part of the programmable logic resource.

17. The method of claim 11 further comprising dynamically adjusting the crossbar switch while data is processing in the programmable logic resource.

* * * * *